US012317588B2

(12) United States Patent
Hong et al.

(10) Patent No.: US 12,317,588 B2
(45) Date of Patent: May 27, 2025

(54) STEP-STACKED NANOWIRE CMOS STRUCTURE FOR LOW POWER LOGIC DEVICE AND METHOD OF MANUFACTURING THE SAME

(71) Applicant: Samsung Electronics Co., Ltd., Suwon-si (KR)

(72) Inventors: Byounghak Hong, Latham, NY (US); Seungchan Yun, Waterford, NY (US); Kang-ill Seo, Albany, NY (US)

(73) Assignee: Samsung Electronics Co., Ltd., Yongin-si (KR)

( * ) Notice: Subject to any disclaimer, the term of this patent is extended or adjusted under 35 U.S.C. 154(b) by 449 days.

(21) Appl. No.: 17/841,510

(22) Filed: Jun. 15, 2022

(65) Prior Publication Data

US 2023/0335556 A1    Oct. 19, 2023

Related U.S. Application Data

(60) Provisional application No. 63/331,166, filed on Apr. 14, 2022, provisional application No. 63/330,663, filed on Apr. 13, 2022.

(51) Int. Cl.
*H01L 27/12* (2006.01)
*H01L 21/02* (2006.01)
(Continued)

(52) U.S. Cl.
CPC ..... *H10D 84/856* (2025.01); *H01L 21/02532* (2013.01); *H01L 21/02603* (2013.01);
(Continued)

(58) Field of Classification Search
CPC .......... H01L 27/0922; H01L 21/02532; H01L 21/02603; H01L 21/30604; H01L 21/308; H01L 21/3247; H01L 21/8221; H01L 21/823807; H01L 29/66439; H01L 29/775; H01L 29/78696; H01L 29/42392; H01L 29/0665; H01L 27/0688; H01L 29/0669; H01L 29/4908; H01L 29/7848;
(Continued)

(56) References Cited

U.S. PATENT DOCUMENTS 11,171,059 B2    11/2021   Chiang et al.
11,201,152 B2    12/2021   Xie et al.
(Continued)

FOREIGN PATENT DOCUMENTS

CN        101894842 A  *  11/2010   ......... H01L 27/1203

*Primary Examiner* — Niki H Nguyen
(74) *Attorney, Agent, or Firm* — Lewis Roca Rothgerber Christie LLP (57) ABSTRACT

A CMOS device including a substrate comprising a shallow trench isolation region, an nFET on the substrate above the shallow trench isolation region, and a pFET. The nFET includes a source region, a drain region, a channel region including a series of nanowires extending from the source region to the drain region, and a gate region around the series of nanowires of the channel region. The nanowires include a first series of nanowires in a first column and a second series of nanowires in a second column adjacent to the first column. The pFET includes a source region, a drain region, a channel region extending from the source region to the drain region, and a gate region on the channel region.

18 Claims, 11 Drawing Sheets

(51) Int. Cl.
*H01L 21/306* (2006.01)
*H01L 21/308* (2006.01)
*H01L 21/324* (2006.01)
*H10D 30/01* (2025.01)
*H10D 30/43* (2025.01)
*H10D 30/67* (2025.01)
*H10D 62/10* (2025.01)
*H10D 84/01* (2025.01)
*H10D 84/03* (2025.01)
*H10D 84/85* (2025.01)
*H10D 88/00* (2025.01)

(52) U.S. Cl.
CPC ...... *H01L 21/30604* (2013.01); *H01L 21/308* (2013.01); *H01L 21/3247* (2013.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/038* (2025.01); *H10D 88/01* (2025.01)

(58) Field of Classification Search
CPC ........... H01L 21/0245; H01L 21/02381; H01L 2029/7858; H01L 29/7926; H01L 29/41733; H10B 10/125
See application file for complete search history.

(56) References Cited

U.S. PATENT DOCUMENTS

| | | |
|---|---|---|
| 2019/0393214 A1 | 12/2019 | Lilak et al. |
| 2020/0098756 A1 | 3/2020 | Lilak et al. |
| 2020/0303375 A1 | 9/2020 | Fukuzaki |
| 2021/0249424 A1* | 8/2021 | Chang .................. H10B 20/25 |
| 2021/0287946 A1 | 9/2021 | Van Dal et al. |
| 2022/0013521 A1 | 1/2022 | Zhang et al. |

* cited by examiner

STEP-STACKED NANOWIRE CMOS STRUCTURE FOR LOW POWER LOGIC DEVICE AND METHOD OF MANUFACTURING THE SAME

CROSS-REFERENCE TO RELATED APPLICATION(S)

The present application claims priority to and the benefit of U.S. Provisional Application No. 63/330,663, filed Apr. 13, 2022, and U.S. Provisional Application No. 63/331,166, filed Apr. 14, 2022, the entire content of both of which are incorporated herein by reference.

BACKGROUND

1. Field

The present disclosure relates to a nanowire CMOS structure and methods of manufacturing the same.

2. Description of the Related Art

The size of transistors has continued to decrease to sustain the scale down of the logic element in semiconductors. However, in the related art, the middle-of-the-line (MOL) contact may have an L-shape due to the scale down of the logic element. Accordingly, related art logic elements may not include sufficient gate controllability and/or may not be suitable for low power-oriented applications.

SUMMARY

The present disclosure relates to various embodiments of a CMOS device and a method of manufacturing a CMOS device. In one embodiment, the CMOS device includes a substrate having a shallow trench isolation region, an n-type field effect transistor (nFET) on the substrate above the shallow trench isolation region, and a p-type field effect transistor (pFET) above the nFET. The nFET includes a source region, a drain region, a channel region having a series of nanowires extending from the source region to the drain region, and a gate region around the series of nanowires of the channel region. The nanowires include a first series of nanowires in a first column and a second series of nanowires in a second column adjacent to the first column. The pFET includes a source region, a drain region, a channel region extending from the source region to the drain region, and a gate region on the channel region.

In another embodiment, the CMOS device includes an nFET having a source region, a drain region, a channel region including a series of nanosheets extending from the source region to the drain region, and a gate region around the series of nanosheets of the channel region.

The present disclosure also relates to various embodiments of a method of manufacturing a CMOS device. In one embodiment, the method includes forming a first stack of alternating silicon-germanium (SiGe) and silicon (Si) layers, forming a second stack of alternating SiGe and Si layers on the first stack, forming a mask on the second stack, etching at least the first stack to form a trench extending to the substrate, selectively removing the SiGe layers of the first stack and the second stack, and annealing the Si layers of the first stack and the second stack to form a first series of nanowires of the nFET device and a second series of nanowires of the pFET device.

This summary is provided to introduce a selection of concepts that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

The present disclosure relates to various embodiments of a CMOS device and a method of manufacturing a CMOS device having an upper transistor (e.g., a p-type field-effect transistor (pFET)) stacked on a lower transistor (e.g., an n-type field-effect transistor (nFET)). Each of the upper and lower transistors includes a series of stacked nanowires to improve gate control and to reduce parasitic capacitance compared to related art vertically stacked CMOS structures. The CMOS device of the present disclosure is also suitable for low power-oriented applications.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1A:
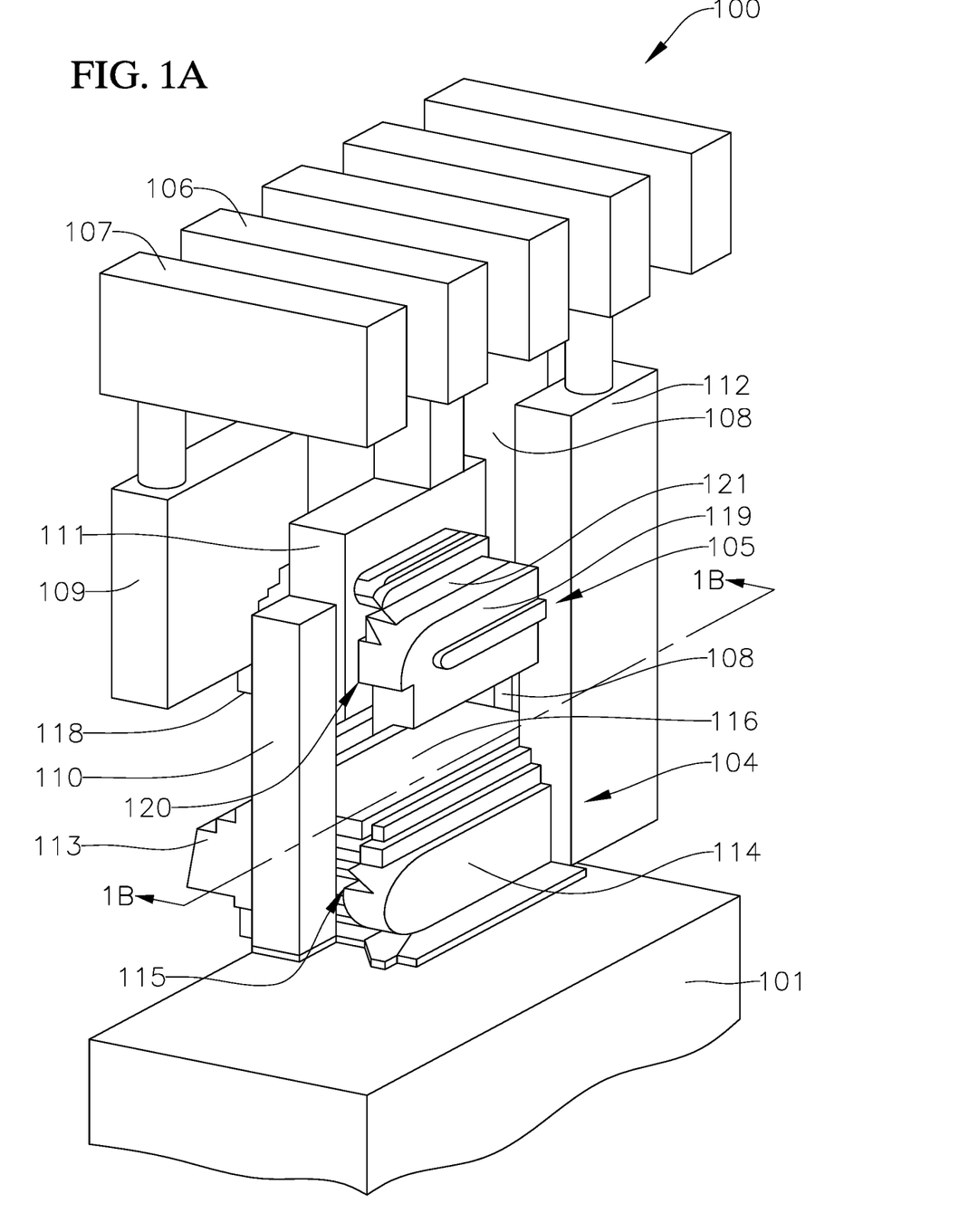
FIGS. 1A-1B are a perspective view and a cross-sectional view, respectively, of a CMOS device according to one embodiment of the present disclosure.
Figure 1B:
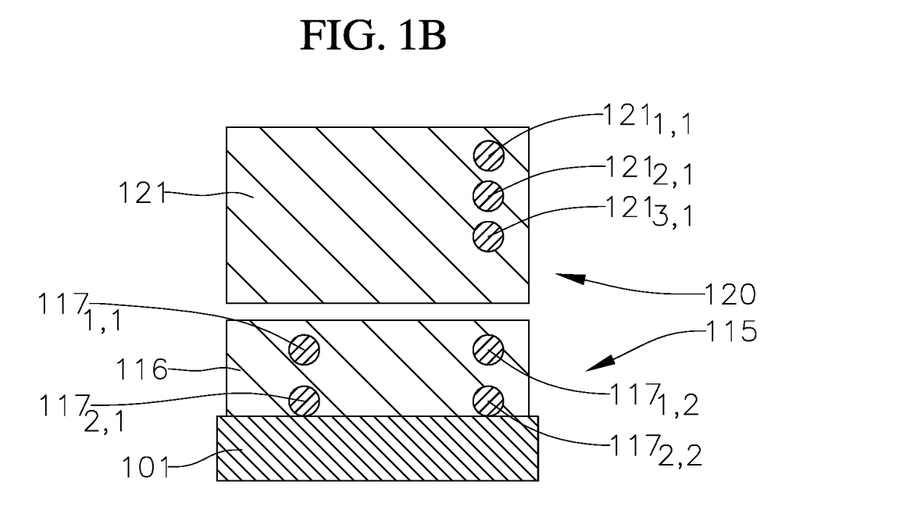

With reference now to FIGS. 1A-1B, a CMOS device 100 according to one embodiment of the present disclosure includes a substrate 101 (e.g., a Silicon (Si) substrate) having a fin 102, a shallow trench isolation (STI) region 103 (shown in FIG. 2) on the substrate 101 and opposite sides of the fin 102, an n-type field-effect transistor (nFET) 104 on the substrate 101, a p-type field-effect transistor (pFET) 105 above the nFET 104, and signal lines 106 and power lines 107 (i.e., a power distribution network (PDN) grid) above the pFET 105. The PDN grid 107 is connected to the nFET 104 and the pFET 105 by power contacts 108 and 109, respectively, and the signal lines 106 are connected to the nFET 104 and the pFET 105 by signal contacts 110 and 111, respectively, and a merged out contact 112.

In the illustrated embodiment, the nFET 104 includes a source region 113 connected to the power contact 108, a drain region 114 connected to the merged out contact 112, a channel region 115 extending between the source region 113 and the drain region 114, and a gate region 116 surrounding the channel region 115 and connected to the signal contact 111. Additionally, in the illustrated embodiment, the channel region 115 includes a plurality of nanowires 117. In the embodiment illustrated in FIGS. 1A-1B, the channel region 115 of the nFET 104 includes four nanowires 117 arranged in a rectangular (e.g., square configuration). That is, in the embodiment illustrated in FIGS. 1A-1B, the channel region 115 of the nFET 104 includes a first pair of stacked nanowires $117_{1,1}$ and $117_{2,1}$ arranged in a first column and a second pair of stacked nanowires $117_{1,2}$ and $117_{2,2}$ arranged in a second column. Additionally, in the illustrated embodiment, the nanowires $117_{1,1}$ and $117_{1,2}$ are aligned (e.g. co-planar) in a first row, and the nanowires $117_{2,1}$ and $117_{2,2}$ are aligned (e.g. co-planar) in a second row below the first row (i.e., the channel region 115 of the nFET 104 includes nanowires $117_{1,1}$ and $117_{1,2}$ arranged in an upper row and nanowires $117_{2,1}$ and $117_{2,2}$ arranged in a lower row). The nanowires 117 of the channel region 115 of the nFET 104 are configured to provide for increased gate controllability due to the gate-all-around (GAA) configuration of the gate 116 around the nanowires 117. The nanowires 117 of the channel region 115 of the nFET 104 are also configured to improve AC performance by reduced leakage and parasitic capacitance compared to related art nFET channel regions.

In the embodiment illustrated in FIGS. 1A-1B, the pFET 105 includes a source region 118 connected to the power contact 109, a drain region 119 connected to the merged out contact 112, a channel region 120 extending between the source region 118 and the drain region 119, and a gate region 121 surrounding the channel region 120 and connected to the signal contact 111. In the illustrated embodiment, the channel region 120 of the pFET 105 includes a plurality of nanowires 122. In the illustrated embodiment, the pFET 105 includes three nanowires $121_{1,1}$, $121_{2,1}$, and $121_{3,1}$ arranged in a column. Additionally, in the illustrated embodiment, the three nanowires $121_{1,1}$, $121_{2,1}$, and $121_{3,1}$ are arranged above the two nanowires $117_{1,2}$ and $117_{2,2}$ in the second column of the channel region 115 in the nFET 104.

Figure 2:
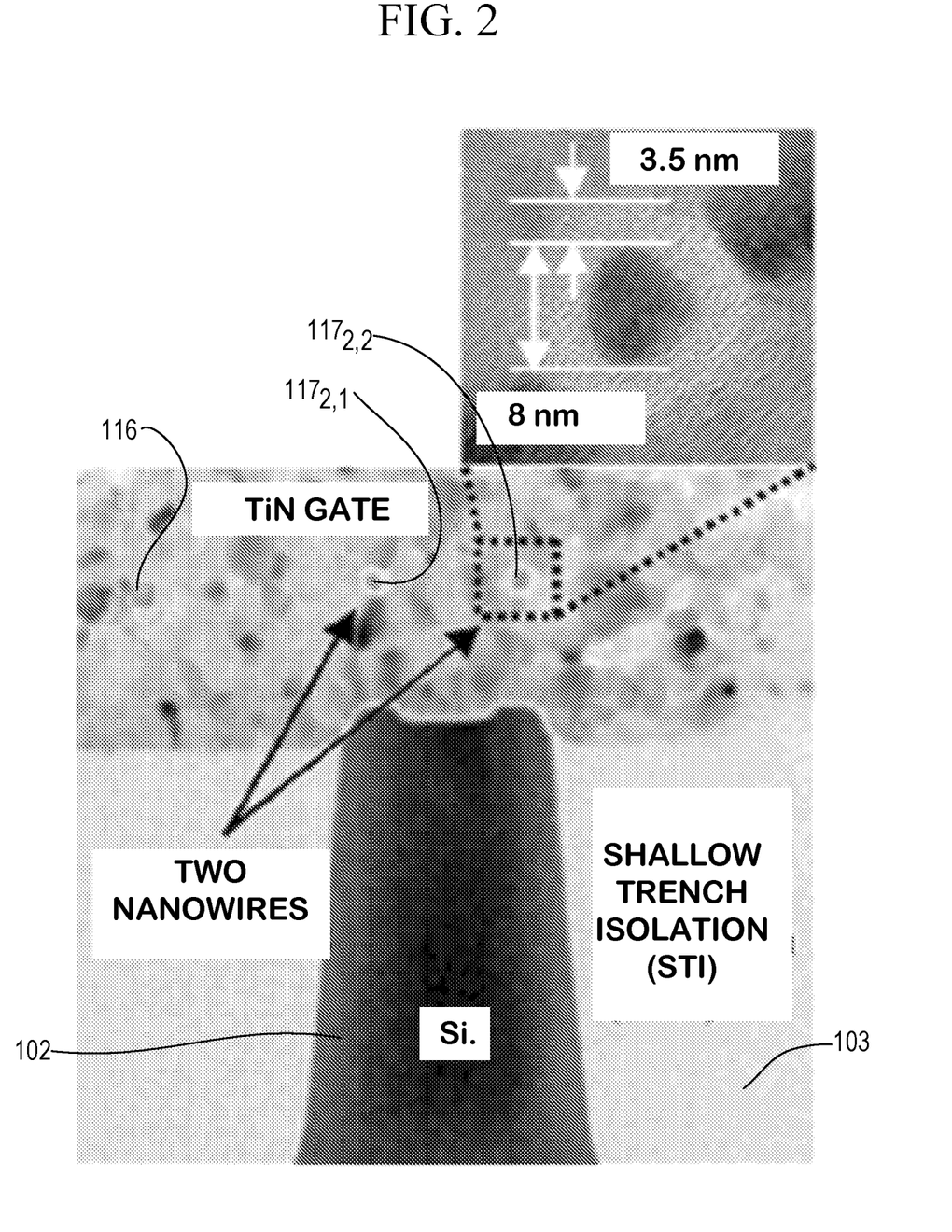
FIG. 2 is an electron microscopy image of the embodiment of the CMOS device illustrated in FIGS. 1A-1B.

FIG. 2 is an electron microscopy image of the fin 102 of the substrate 101, the STI region 103, two of the nanowires $117_{2,1}$ and $117_{2,2}$ of the channel region 115 of the nFET 104, and the gate region 116 surrounding the nanowires 117. As shown in FIG. 2, the nanowires 117 have a height (e.g., a diameter) of approximately 8 nm. In one or more embodiments, the nanowires 117 may have a height and/or a width (e.g., a diameter) in a range from approximately 6 nm to approximately 10 nm. Additionally, as illustrated in the embodiment of FIG. 2, the gate region 116 may be formed of titanium nitride (TiN).

In one or more embodiments, the channel regions 115 and 120 of the nFET 104 and the pFET 105, respectively, may have other suitable configurations. For instance, in the embodiment illustrated in FIG. 3, the channel region 115 of the nFET 104 includes six nanowires 117 arranged in a rectangular configuration including three columns of two nanowires each (i.e., two nanowires $117_{1,1}$ and $117_{2,1}$ arranged in a first column, two nanowires $117_{1,2}$ and $117_{2,2}$ arranged in a second column, and two nanowires $117_{1,3}$ and $117_{3,3}$ arranged in a third column). That is, in the embodiment illustrated in FIG. 3, the channel region 115 of the nFET 104 includes three nanowires $117_{1,1}$, $117_{1,2}$, and $117_{1,3}$ arranged in a first row, and three nanowires $117_{2,1}$, $117_{2,2}$, and $117_{2,3}$ arranged in a second row below the first row).

Figure 3:
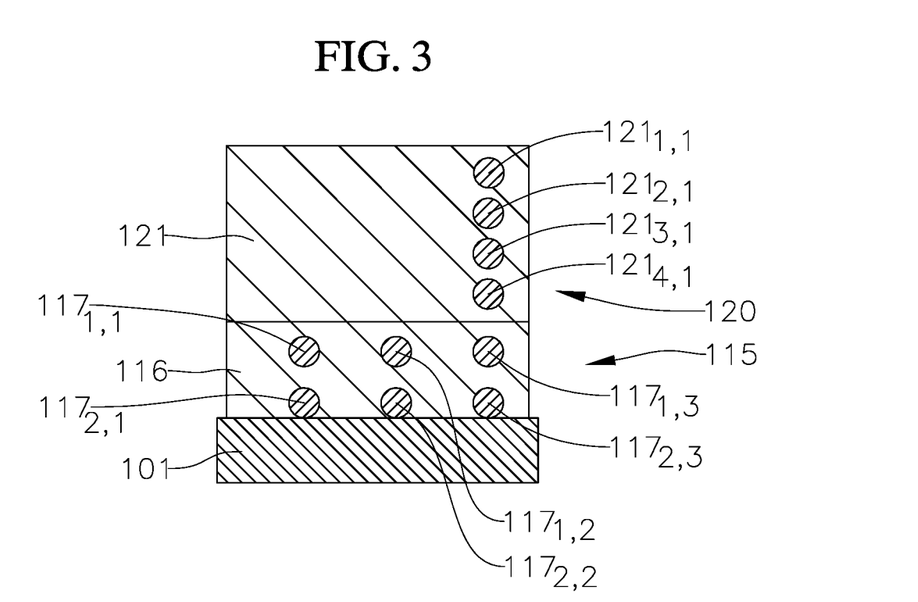
FIG. 3 is a cross-sectional view of a CMOS device according to another embodiment of the present disclosure.

Additionally, in the illustrated embodiment, the channel region 120 the pFET 105 includes four nanowires $121_{1,1}$, $121_{2,1}$, $121_{3,1}$, and $121_{4,1}$ arranged in a column. Additionally, in the illustrated embodiment, the four nanowires $121_{1,1}$, $121_{2,1}$, $121_{3,1}$, and $121_{4,1}$ are arranged above the two nanowires $117_{1,3}$ and $117_{2,3}$ in the third column of the channel region 115 in the nFET 104.

Figure 4:
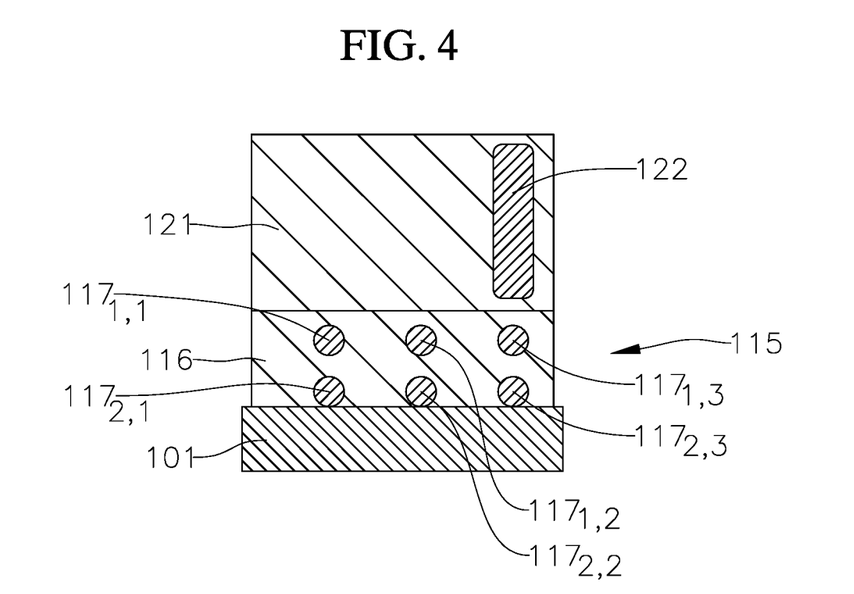
FIG. 4 is a cross-sectional view of a CMOS device according to a further embodiment of the present disclosure.

In the embodiment illustrated in FIG. 4, the channel region 115 of the nFET 104 includes six nanowires 117 arranged in a rectangular configuration including three columns of two nanowires each (i.e., two nanowires $117_{1,1}$ and $117_{2,1}$ arranged in a first column, two nanowires $117_{1,2}$ and $117_{2,2}$ arranged in a second column, and two nanowires $117_{1,3}$ and $117_{3,3}$ arranged in a third column). That is, in the embodiment illustrated in FIG. 3, the channel region 115 of the nFET 104 includes three nanowires $117_{1,1}$, $117_{1,2}$, and $117_{1,3}$ arranged in a first row, and three nanowires $117_{2,1}$, $117_{2,2}$, and $117_{2,3}$ arranged in a second row below the first row).

In the embodiment illustrated in FIG. 4, the channel region 120 of the pFET 105 is a vertically-oriented nanosheet 122 above the two nanowires $117_{1,3}$ and $117_{3,3}$ in the third column of the channel region 115 in the nFET 104 (e.g., the vertically-oriented nanosheet 122 is aligned with the two nanowires $117_{1,3}$ and $117_{3,3}$ in the third column of the channel region 115 in the nFET 104).

Figure 5A:
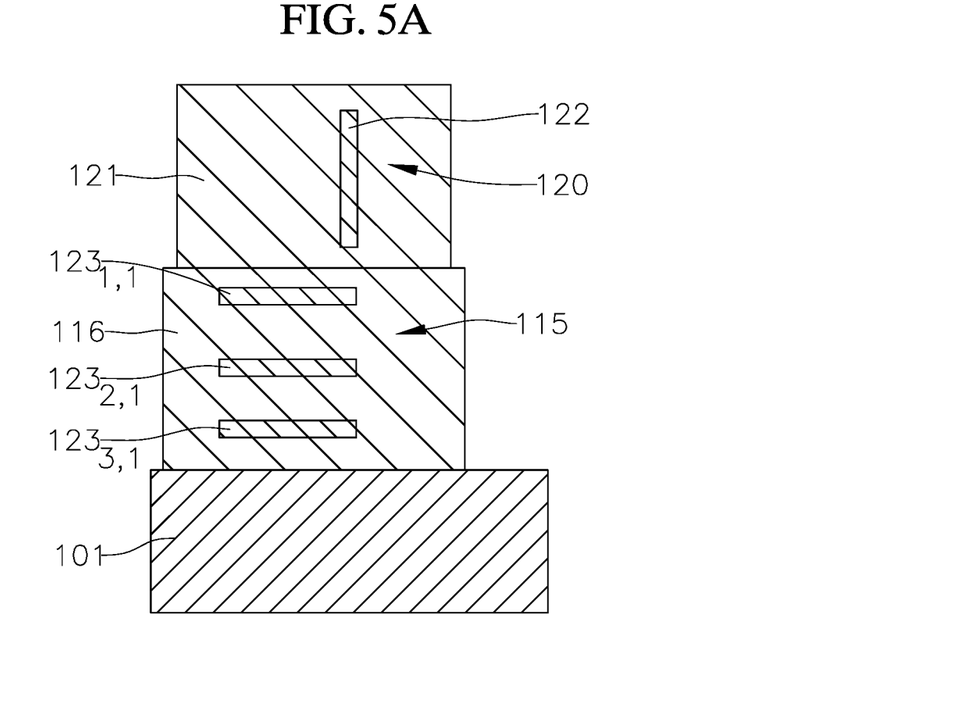
FIGS. 5A-5B are cross-sectional views of a CMOS device according to embodiments of the present disclosure.
Figure 5B:
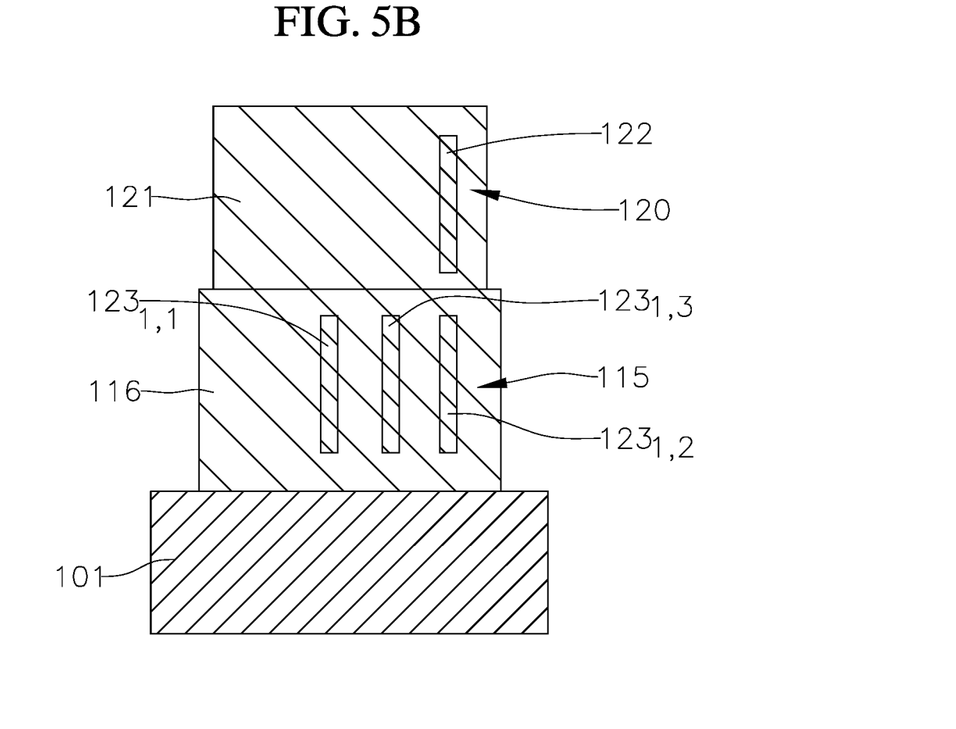

With reference now to the embodiments illustrated in FIGS. 5A-5B, the channel region 115 of the nFET 104 includes three nanosheets 123, and the channel region 120 of the pFET 105 includes a single vertically-oriented nanosheet 122. In the embodiment illustrated in FIG. 5A, the channel region 115 of the nFET 104 includes three horizontally-oriented nanosheets $123_{1,1}$ $123_{2,1}$ and $123_{3,1}$ that are stacked on top of each other in a column. In the embodiment illustrated in FIG. 5B, the channel region 115 of the nFET 104 includes three vertically-oriented nanosheets $123_{1,1}$ $123_{1,2}$ and $123_{1,3}$ that are arranged side-by-side in a row. Additionally, in the embodiment illustrated in FIG. 5B, the vertically-oriented nanosheet 122 of the pFET 105 is above (e.g., aligned with) the third vertically-oriented nanosheet $123_{1,3}$ of the channel region 115 in the nFET 104.

Figure 6:
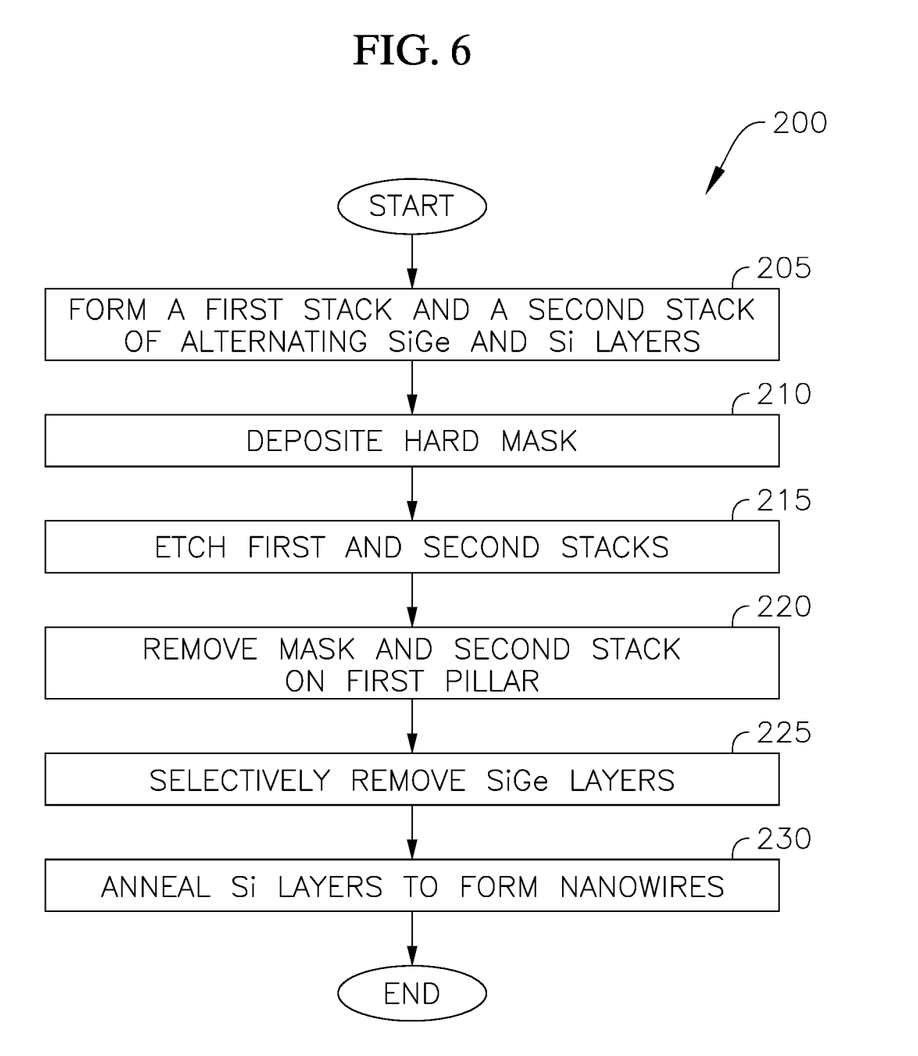
FIG. 6 is a flowchart illustrating tasks of a method of manufacturing a CMOS device according to one embodiment of the present disclosure.

FIG. 6 is a flowchart depicting tasks of a top down monolithic method 200 of manufacturing a CMOS device 300 including stacked nFET and pFET devices 301 and 302 according to one embodiment of the present disclosure. FIGS. 7A-7F are schematic diagrams depicting the tasks of manufacturing the CMOS device 300 according to the embodiment of FIG. 6.

Figure 7A:
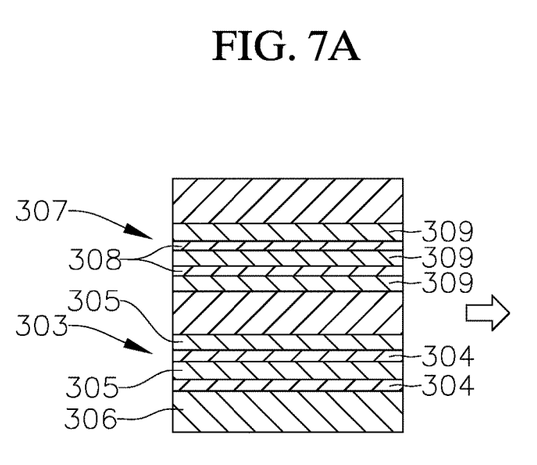
FIGS. 7A-7F illustrate tasks of manufacturing the CMOS device according to the embodiment illustrated in FIG. 6.

With reference now to FIGS. 6 and 7A, the method 200 includes a task 205 of forming (e.g., growing) a first stack 303 of alternating silicon-germanium (SiGe) layers 304 and silicon (Si) layers 305 on a substrate 306, and forming (e.g., growing) a second stack 307 of alternating SiGe layers 308 and Si layers 309 on the first stack 303 of the alternating SiGe layers 304 and the Si layers 305. In the illustrated embodiment, the first stack 303 includes two Si layers 305 and the second stack 307 includes three Si layers 309, although in one or more embodiments the first stack 303 and the second stack 307 may include any other suitable number of Si layers depending on the number of desired nanowires in the nFET device 301 and the pFET device 302.

Figure 7B:
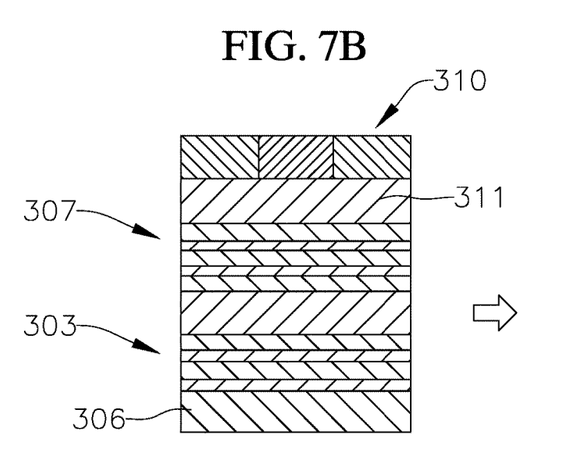

With reference now to FIGS. 6 and 7B, the method 200 also includes a task 210 of depositing a patterned hard mask 310 (e.g., a photomask) on an uppermost layer 311 of the second stack 307 formed in FIGS. 6 and 7A. The patterned hard mask 310 includes a first portion 310a and a second portion 310b. In one or more embodiments, the second portion 310b of the patterned hard mask 310 includes an opening that is configured to permit an etchant (e.g., a wet or dry etchant, such as a chromium etchant) to pass therethrough. In this manner, the second portion 310b of the patterned hard mask 310 defines the portion of the first and second stacks 303, 307 that will be etched away in a subsequent task of the method 200.

Figure 7C:
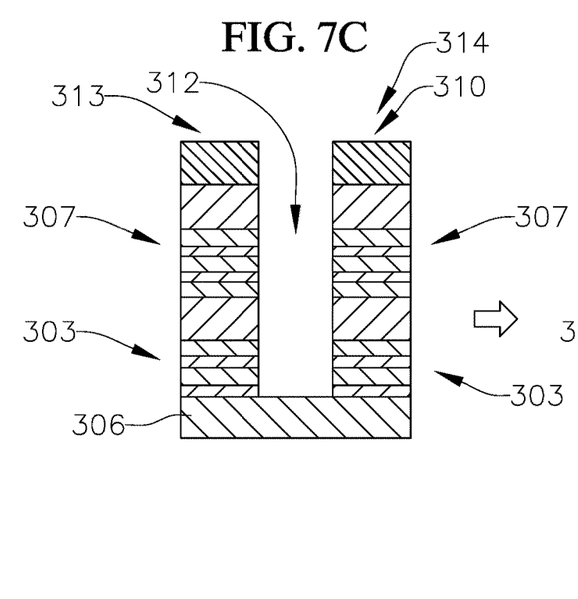

In FIGS. 6 and 7C, the method 200 includes a task 215 of etching a portion of the first and second stacks 303 and 307 based on the pattern of the hard mask 310 deposited in FIG. 7B. Following the task 215 of etching the first and second stacks 303 and 307, a trench 312 extends completely to the substrate 306 and the trench 312 separates the first and second stacks 303 and 307 into a first pillar 313 and a second pillar 314 (i.e., two separate pillars).

Figure 7D:
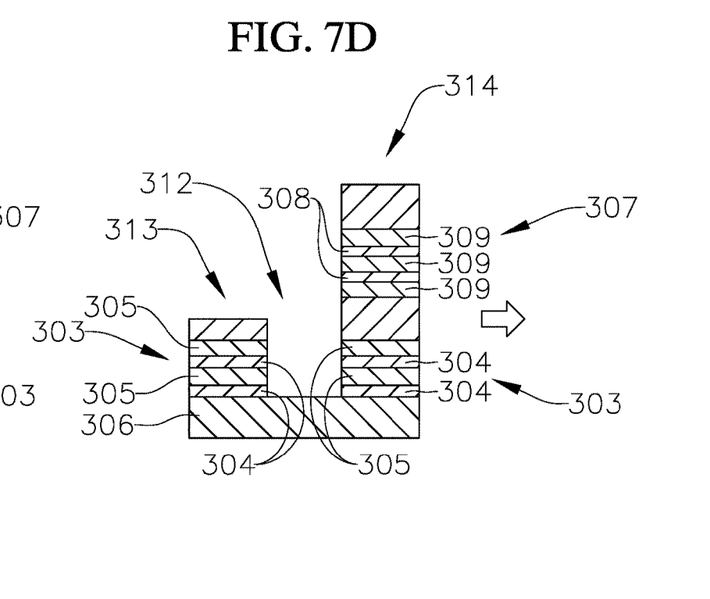

With reference now to the embodiment in FIGS. 6 and 7D, the method 200 includes a task 220 of removing the mask 310 and the second stack 307 of the SiGe layers 308 and the Si layers 309 from the first pillar 313. Accordingly, following the task 220 depicted in FIG. 7D, the first pillar 313 includes only the first stack 303 of the SiGe layers 304 and the Si layers 305, and the second pillar 314 includes both the first stack 303 of the SiGe layers 304 and the Si layers 305, and the second stack 307 of the SiGe layers 308 and the Si layers 309.

Figure 7E:
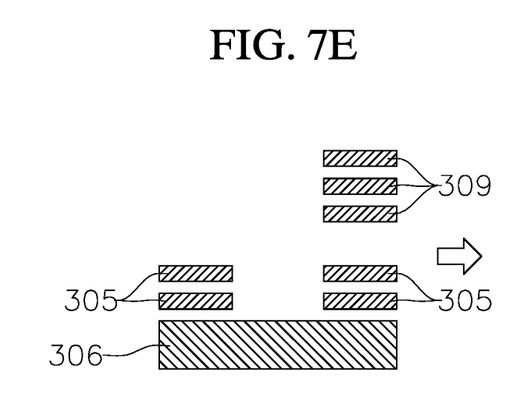

With reference now to the embodiment in FIGS. 6 and 7E, the method 200 includes a task 225 of selectively removing the SiGe layers 304 and 308. Following the task 225 of selectively removing the SiGe layers 304 and 308, the Si layers 305 and 309 remain.

Figure 7F:
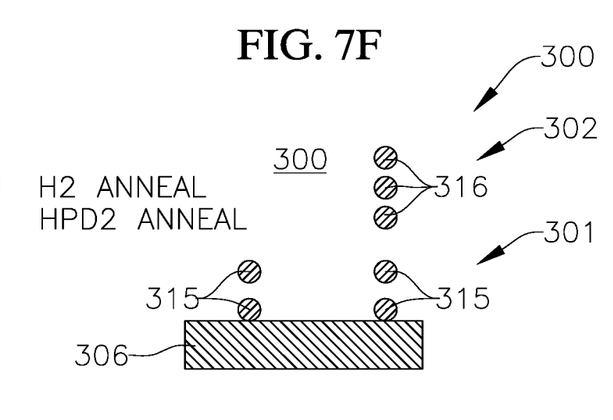

With reference now to the embodiment in FIGS. 6 and 7F, the method 200 includes a task 230 of annealing the Si layers 305 and 309 to form nanowires 315 and 316, respectively. The annealing performed in task 225 may be hydrogen ($H_2$) annealing performed at a high temperature (e.g., 600° C. to 1,200° C.) and high flow rate (e.g., 5 to 40 liters/minute) to physically shape the Si layers 305 and 309 into the nanowires 315 and 316, respectively, of the nFET device 301 and the pFET device 302, respectively. The annealing performed in task 230 may be high-pressure deuterium (HPD$_2$) annealing. This task 230 may be performed in an epitaxial reactor.

The CMOS device 300 may be completed by forming a gate-all-around structure (GAA) around the nanowires 315 and 316 to complete the nFET and the pFET devices 301 and 302, forming signal lines and power lines (a power distribution network (PDN) grid) above the pFET device 302, and connecting the signal lines and the power lines to the nFET and the pFET devices 301 and 302.

Figure 8:
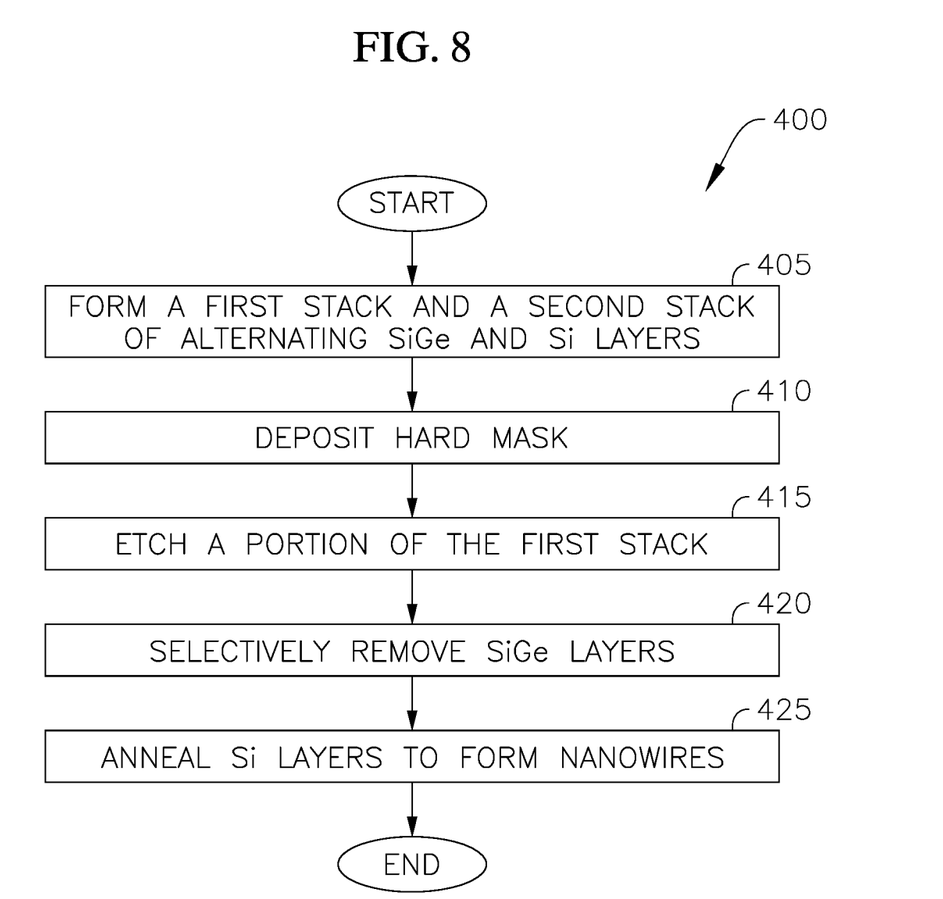
FIG. 8 is a flowchart illustrating tasks of a method of manufacturing a CMOS device according to one embodiment of the present disclosure.

FIG. 8 is a flowchart depicting tasks of a top down monolithic method 400 of manufacturing a CMOS device 500 including stacked nFET and pFET devices 501 and 502 according to one embodiment of the present disclosure. FIGS. 9A-9G are schematic diagrams depicting the tasks of manufacturing the CMOS device 500 according to the embodiment of FIG. 8.

Figure 9A:
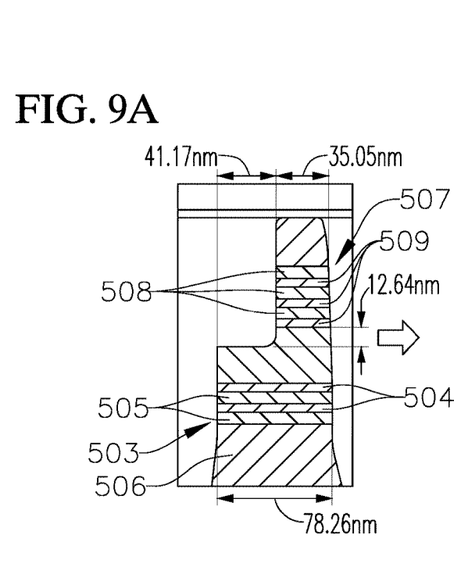
FIGS. 9A-9G illustrate tasks of manufacturing the CMOS device according to the embodiment illustrated in FIG. 8.

With reference now to FIGS. 8 and 9A, the method 400 includes a task 405 of forming (e.g., growing) a first stack 503 of alternating silicon-germanium (SiGe) layers 504 and silicon (Si) layers 505 on a substrate 506, and forming (e.g., growing) a second stack 507 of alternating SiGe layers 508 and the Si layers 509 on the first stack 503 of the alternating SiGe layers 504 and the Si layers 505. In the illustrated embodiment, the first stack 503 includes two Si layers 505 and the second stack 507 includes three Si layers 509, although in one or more embodiments the first stack 503 and the second stack 507 may include any other suitable number of Si layers depending on the number of desired nanowires in the nFET device 501 and the pFET device 502. Additionally, in the illustrated embodiment, the first stack 503 of the alternating SiGe layers 504 and the Si layers 505 are wider than the second stack 507 of the alternating SiGe layers 508 and the Si layers 509 (i.e., the second stack 507 of the alternating SiGe layers 508 and the Si layers 509 is narrower than the first stack 503 of the alternating SiGe layers 504 and the Si layers 505). In one or more embodiments, the first stack 503 and the second stack 507 may initially have the same (or substantially the same) width and then a portion of the second stack 507 may be removed (e.g., wet or dry etched utilizing a hard mask and an etch stop layer between the first stack 503 and the second stack 507 to prevent removal of the first stack 503) such that the first stack 503 is wider than the second stack 507. In one or more embodiments, the first stack 503 of the alternating SiGe layers 504 and the Si layers 505 has a width W1 in a range from approximately 70 nm to approximately 85 nm, and the second stack 507 of the alternating SiGe layers 508 and the Si layers 509 has a width W2 in a range from approximately 30 nm to approximately 40 nm. In the illustrated embodiment, the width W1 of the first stack 503 of the alternating SiGe layers 504 and the Si layers 505 is approximately 78.26 nm, and the width W2 of the second stack 507 of the alternating SiGe layers 508 and the Si layers 509 is approximately 35.05 nm. Accordingly, in one or more embodiments, a portion of the first stack 503 of the alternating SiGe layers 504 and the Si layers 505 extends beyond the second stack 507 of the alternating SiGe layers 508 and the Si layers 509 (i.e., a portion of the first stack 503 of the alternating SiGe layers 504 and the Si layers 505 is uncovered by second stack 507 of the alternating SiGe layers 508 and the Si layers 509). In one or more embodiments, the portion of the first stack 503 of the alternating SiGe layers 504 and the Si layers 505 that extends beyond the second stack 507 of the alternating SiGe layers 508 and the Si layers 509 has a width W3 in a range from approximately 30 nm to approximately 55 nm. In the illustrated embodiment, the width W3 of the portion of the first stack 503 of the alternating SiGe layers 504 and the Si layers 505 that extends beyond the second stack 507 of the alternating SiGe layers 508 and the Si layers 509 is approximately 41.17 nm. Additionally, in one or more embodiments, the Si layers 505 and 509 in the first and second stacks 503 and 507 have a thickness in a range from approximately 10 nm to approximately nm. In the illustrated embodiment, the thickness of the Si layers 505 and 509 in the first and second stacks 503 and 507 is approximately 12.64 nm.

Figure 9B:
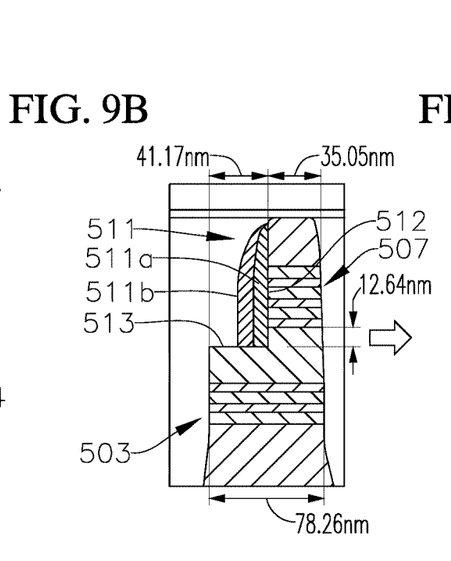
Figure 9C:
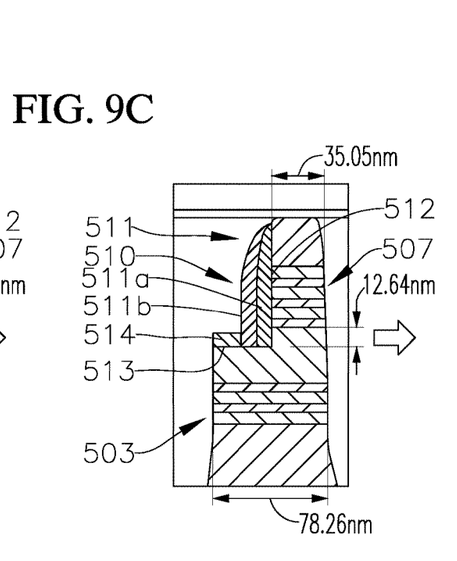

With reference now to FIGS. 8 and 9B-9C, the method 400 also includes a task 410 of depositing a hard mask 510. As illustrated in FIG. 9B, a first portion 511 of the hard mask 510 is formed (e.g., deposited) along a sidewall 512 of the second stack 507 and on a portion of an uppermost surface 513 the first stack 503 that is uncovered by the second stack 507. That is, the first portion 511 of the hard mark 510 is a liner or spacer extending along the sidewall 512 of the second stack 507. In the illustrated embodiment, the first portion 511 of the hard mask 501 includes two layers, an inner layer 511a directly on the sidewall 512 of the second stack 507, and an outer layer 511b on the inner layer 511a. As illustrated in FIG. 9C, a second portion 514 of the hard mask 510 is formed (e.g., deposited) on a remainder of the uppermost surface 513 of the first stack 503. The task 410 of depositing the hard mask 510, including the first portion 511 and the second portion 514, may utilize any suitable process(es) or technique(s), such as atomic-layer deposition (ALD), chemical vapor deposition (CVD), physical vapor deposition (CVD) (e.g., sputtering or evaporation CVD), or combinations thereof.

Figure 9D:
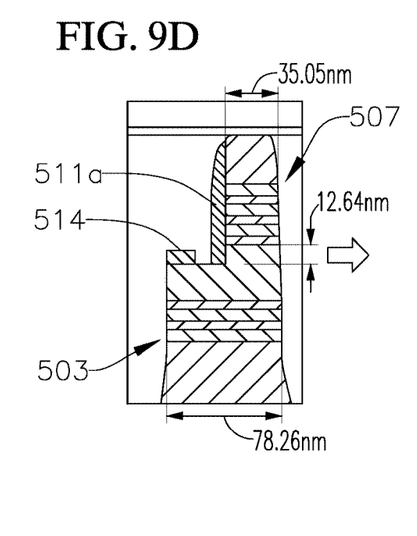
Figure 9E:
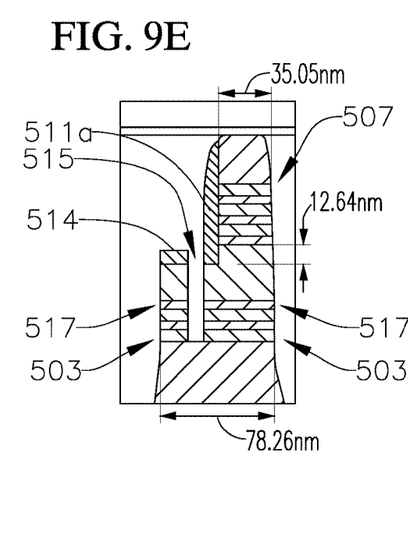

In FIGS. 8 and 9D-9E, the method 400 includes a task 415 of etching a portion of the first stack 303 based on the pattern of the hard mask 510 deposited in FIGS. 9B-9C. In FIG. 9D, the outer layer 511b of the first portion 511 of the hard mask 510 is selectively removed, and in FIG. 9E, a portion of the first stack 303 underneath the outer layer 511b of the first portion 511 of the hard mask 510 is removed by etching (e.g., wet or dry etching). Following the task 415 of etching the first stack 303, a trench 515 extends completely to the substrate 506 and the trench 515 separates the first stack 303 into a first pillar 516 and a second pillar 517 (i.e., two separate pillars). Following the task 415 depicted in FIG. 9E, the first pillar 516 includes only the first stack 503 of the SiGe layers 504 and the Si layers 505, and the second pillar 517 includes both the first stack 503 of the SiGe layers 504 and the Si layers 505, and the second stack 507 of the SiGe layers 508 and the Si layers 509.

Figure 9F:
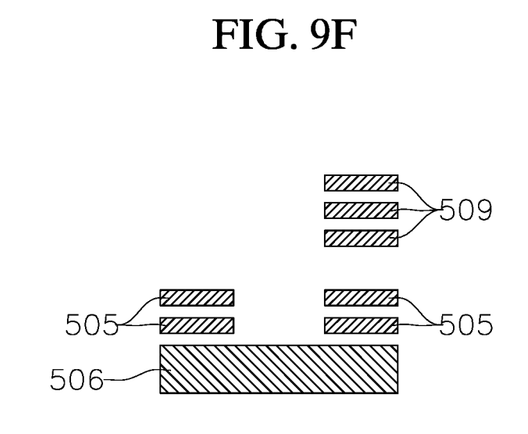

With reference now to the embodiment in FIGS. 8 and 9F, the method 400 includes a task 420 of selectively removing the SiGe layers 504 and 508 of the first and second stacks 503 and 507. Following the task 420 of selectively removing the SiGe layers 504 and 508, the Si layers 505 and 509 remain.

Figure 9G:
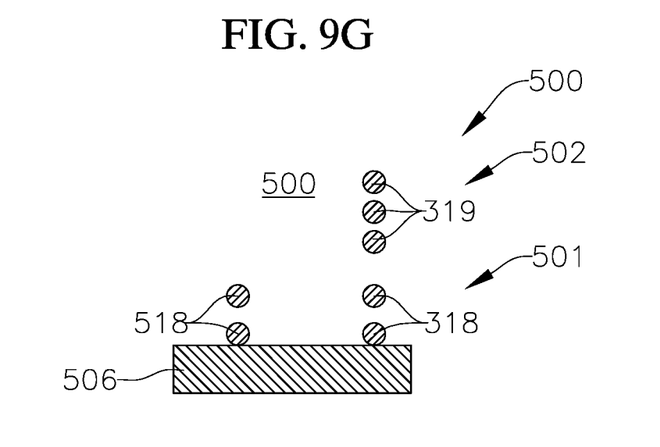

With reference now to the embodiment in FIGS. 8 and 9G, the method 400 includes a task 425 of annealing the Si layers 505 and 509 to form nanowires 518 and 519, respectively. The annealing performed in task 425 may be hydrogen (H$_2$) annealing performed at a high temperature (e.g., 600° C. to 1,200° C.) and high flow rate (e.g., 5 to 40 liters/minute) to physically shape the Si layers 505 and 509 into the nanowires 518 and 519, respectively, of the nFET device 501 and the pFET device 502, respectively. The annealing performed in task 425 may be high-pressure deuterium (HPD$_2$) annealing. This task 425 may be performed in an epitaxial reactor.

The CMOS device 500 may be completed by forming a gate-all-around structure (GAA) around the nanowires 518 and 519 to complete the nFET and the pFET devices 501 and 502, forming signal lines and power lines (i.e., a power distribution network (PDN) grid) above the pFET device 502, and connecting the signal lines and the power lines to the pFET and the nFET devices 501 and 502.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention.

What is claimed is:

1. A CMOS device comprising:
   a substrate comprising a fin;
   an n-type field effect transistor (nFET) on the substrate above the fin, the nFET comprising:
     a source region;
     a drain region;
     a channel region comprising a plurality of nanowires extending from the source region to the drain region, the plurality of nanowires comprising a first plurality of nanowires in a first column and a second plurality of nanowires in a second column adjacent to the first column; and
     a gate region around the plurality of nanowires of the channel region; and
   a p-type field effect transistor (pFET) above the nFET, the pFET comprising:
     a source region;
     a drain region;
     a channel region extending from the source region to the drain region; and
     a gate region on the channel region.

2. The CMOS device of claim 1, wherein the channel region of the pFET comprises a vertically-oriented nanosheet.

3. The CMOS device of claim 1, wherein the channel region of the pFET comprises a plurality of nanowires.

4. The CMOS device of claim 1, wherein the plurality of nanowires of the channel region of the nFET are arranged in a rectangular configuration.

5. The CMOS device of claim 1, wherein the first plurality of nanowires comprises two nanowires arranged in the first column, and wherein the second plurality of nanowires comprises two nanowires arranged in the second column.

6. The CMOS device of claim 5, wherein the channel region of the pFET comprises three nanowires arranged in a column above the second column.

7. The CMOS device of claim 1, wherein the plurality of nanowires of the channel region of the nFET further comprises a third plurality of nanowires in a third column adjacent to the second column.

8. The CMOS device of claim 7, wherein the channel region of the pFET comprises four nanowires arranged in a column above the third column.

9. A CMOS device comprising:
   a substrate comprising a fin;
   an n-type field effect transistor (nFET) on the substrate above the fin, the nFET comprising:
     a source region;
     a drain region;
     a channel region comprising a plurality of nanosheets extending from the source region to the drain region; and
     a gate region around the plurality of nanosheets of the channel region; and
   a p-type field effect transistor (pFET) above the nFET, the pFET comprising:
     a source region;
     a drain region;
     a channel region comprising at least one nanosheet extending from the source region to the drain region; and
     a gate region on the channel region,
   wherein the plurality of nanosheets of the nFET comprises three horizontally-oriented nanosheets arranged in a column.

10. The CMOS device of claim 9, wherein the channel region of the pFET comprises a single vertically-oriented nanosheet.

11. A method of manufacturing a CMOS device comprising an n-type field effect transistor (nFET) and a p-type field effect transistor (pFET) above the nFET, the method comprising:
    forming a first stack of alternating silicon-germanium (SiGe) and silicon (Si) layers on a substrate;
    forming a second stack of alternating SiGe and Si layers on the first stack;
    forming a mask on the second stack;
    etching at least the first stack, the etching forming a trench extending to the substrate;
    selectively removing the SiGe layers of the first stack and the second stack; and
    shaping the Si layers of the first stack and the second stack to form a first plurality of nanowires of the nFET device and a second plurality of nanowires of the pFET device.

12. The method of claim 11, wherein the first stack is completely covered by the second stack.

13. The method of claim 12, wherein the etching at least the first stack comprises etching the first stack and the second stack, the etching forming a first column comprising the first stack and the second stack, and a second column comprising the first stack and the second stack.

14. The method of claim 13, further comprising etching the second stack from the first column.

15. The method of claim 11, wherein a portion of the first stack is uncovered by the second stack.

16. The method of claim 15, wherein the etching at least the first stack comprises etching only the first stack among the first stack and the second stack.

17. The method of claim 11, wherein the shaping the Si layers comprises annealing the Si layers.

18. The method of claim 17, wherein the annealing comprises a process selected from the group consisting of hydrogen ($H_2$) annealing at a high temperature in a range from approximately 600° C. to approximately 1,200° C. and at a flow rate from approximately 5 liters/minute to approximately 40 liters/minute, and high-pressure deuterium ($HPD_2$) annealing.

* * * * *